(12) United States Patent
Wang

(10) Patent No.: US 7,872,307 B2
(45) Date of Patent: Jan. 18, 2011

(54) POWER MOSFET ARRAY

(75) Inventor: Ting-Shing Wang, Hsinchu Hsien (TW)

(73) Assignee: ProMOS Technologies Inc., Hsinchu (TW)

(*) Notice: Subject to any disclaimer, the term of this patent is extended or adjusted under 35 U.S.C. 154(b) by 315 days.

(21) Appl. No.: 12/115,552

(22) Filed: May 6, 2008

(65) Prior Publication Data

US 2009/0096038 A1 Apr. 16, 2009

(30) Foreign Application Priority Data

Oct. 12, 2007  (TW) .............................. 96138177 A

(51) Int. Cl.
*H01L 29/78* (2006.01)
(52) U.S. Cl. ................ 257/331; 257/332; 257/E29.257
(58) Field of Classification Search ................ 257/331, 257/332, E29.257, 341
See application file for complete search history.

(56) References Cited

U.S. PATENT DOCUMENTS

| 6,043,125 | A | * | 3/2000 | Williams et al. ............ 438/270 |
| 7,067,879 | B1 | | 6/2006 | Dyer et al. |
| 2002/0190313 | A1 | | 12/2002 | Takaishi et al. |
| 2004/0203200 | A1 | | 10/2004 | Williams et al. |
| 2006/0284217 | A1 | * | 12/2006 | Kumar et al. ................ 257/266 |

FOREIGN PATENT DOCUMENTS

JP 2001257349 9/2001

* cited by examiner

Primary Examiner—Jerome Jackson, Jr.
Assistant Examiner—Paul A Budd
(74) Attorney, Agent, or Firm—Jianq Chyun IP Office

(57) ABSTRACT

A power metal-oxide-semiconductor field-effect transistor (MOSFET) array structure is provided. The power MOSFET array is disposed under a gate pad, and space under the gate pad can be well used to increase device integration. When the array and the conventional power MOSFET array disposed under the source pad are connected to an array pair by using circuit connection region, the same gate pad and source pad can be shared, so as to achieve an objective of increasing device integration.

16 Claims, 4 Drawing Sheets

POWER MOSFET ARRAY

CROSS-REFERENCE TO RELATED APPLICATION

This application claims the priority benefit of Taiwan application serial no. 96138177, filed on Oct. 12, 2007. The entirety of the above-mentioned patent application is hereby incorporated by reference herein and made a part of this specification.

BACKGROUND OF THE INVENTION

1. Field of the Invention

The present invention relates to a metal-oxide-semiconductor field-effect transistor (MOSFET) structure. More particularly, the present invention relates to a power MOSFET array structure located under a gate pad.

2. Description of Related Art

Power MOSFET can be used as high voltage device with current applicable operating voltage of up to higher than 4500 volts, and is mainly used as switching apparatus. Commonly, the MOSFET is of a planar structure, and each end point in the transistor is only several micrometers away from a chip surface. All the power devices are of a vertical structure, such that the devices can bear high voltage and high current at the same time. The bearable voltage of the power MOSFET depends on doping concentration and thickness of n-type epitaxy layer, and the current capable of passing through the power MOSFET depends on channel width of the device. The wider the channel is, the more current can be accommodated. Under fixed channel size, the current is directly proportional to channel density. Generally speaking, in the conventional art, the channel density is increased by means of reducing distance between basic devices. When volume of the transistor is reduced, not only the space is saved, but also the cost is reduced. Therefore, the industry urgently needs a method of reducing the volume of the power MOSFET array.

The basic devices of the MOSFET array include a substrate, an epitaxy layer, a source region, gates, a source pad, and a gate pad etc. In the conventional art, the source pad is disposed above the power MOSFET array and is connected to the source region, and the gate pad is disposed beside the array and is connected to the gate. A space exists under the gate pad, and is useless. Therefore, the industry urgently needs a method of well utilizing the space under the gate pad, thereby reducing the volume of the array and increasing the device integration.

SUMMARY OF THE INVENTION

Accordingly, the present invention is directed to provide a power MOSFET array structure, which is capable of disposing the power MOSFET array under the gate pad, so as to well utilize the space under the gate pad, and to increase device integration.

The present invention is further directed to provide a power MOSFET array pair structure, which is capable of connecting the power MOSFET array disposed under the gate pad and the conventional power MOSFET array disposed under the source pad, so as to share the same gate pad and source pad, thereby saving the volume of the array pair, and increasing the device integration.

The present invention provides a power MOSFET array structure. In the structure, a gate pad is disposed above the power MOSFET array. The power MOSFET array includes a substrate, an epitaxy layer, a plurality of gates, a source region, and a gate pad. The substrate serves as a drain, and the substrate has a device region. The epitaxy layer is disposed on the substrate, the plurality of gates is disposed on the epitaxy layer in the device region, and the gates are mutually electrically insulated. The source region is disposed on the epitaxy layer between the gates, in which the source region and the gates form the power MOSFET array. The gate pad is disposed above the power MOSFET array, and the gate pad is electrically connected to the gates.

The present invention provides a power MOSFET array pair structure. Two power MOSFET arrays share the same gate pad and source pad through the connection of the circuit connection region. The power MOSFET array pair includes a substrate, an epitaxy layer, source regions, a gate region, a gate pad, and a source pad. The substrate has a first device region, a second device region, and a circuit connection region, a portion of the substrate in the first device region serves as a first drain, and a portion of the substrate in the second device region serves as a second drain. The epitaxy layer is disposed on the substrate. A plurality of first gates is disposed on the epitaxy layer of the first device region, in which the first gates are mutually electrically insulated. A first source region is disposed on the epitaxy layer between the first gates, and the first source region and the first gates form a first power MOSFET array. A plurality of second source regions is disposed on the epitaxy layer, in which the second source regions are mutually electrically insulated. A second gate is disposed on the epitaxy layer between the second source regions, and the second gate and the second source regions form a second power MOSFET array. The gate pad is disposed right above the first power MOSFET array, the gate pad is electrically connected to the first gates, and is electrically connected to the second gate in the second device region through the circuit connection region. The source pad is disposed right above the second power MOSFET array, in which the source pad is electrically connected to the second source regions, and is electrically connected to the first source in the first device region through the circuit connection region.

In the present invention, the MOSFET array is disposed under the gate pad, so as to well utilize the originally idle space under the gate pad and to increase the device integration. By adopting the circuit connection region, the MOSFET array under the gate pad and the conventional MOSFET array disposed under the source pad form an array pair, so as to share the same gate pad and source pad, thereby reducing the volume of the array pair, such that the application scope of the power MOSFET array is broader.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
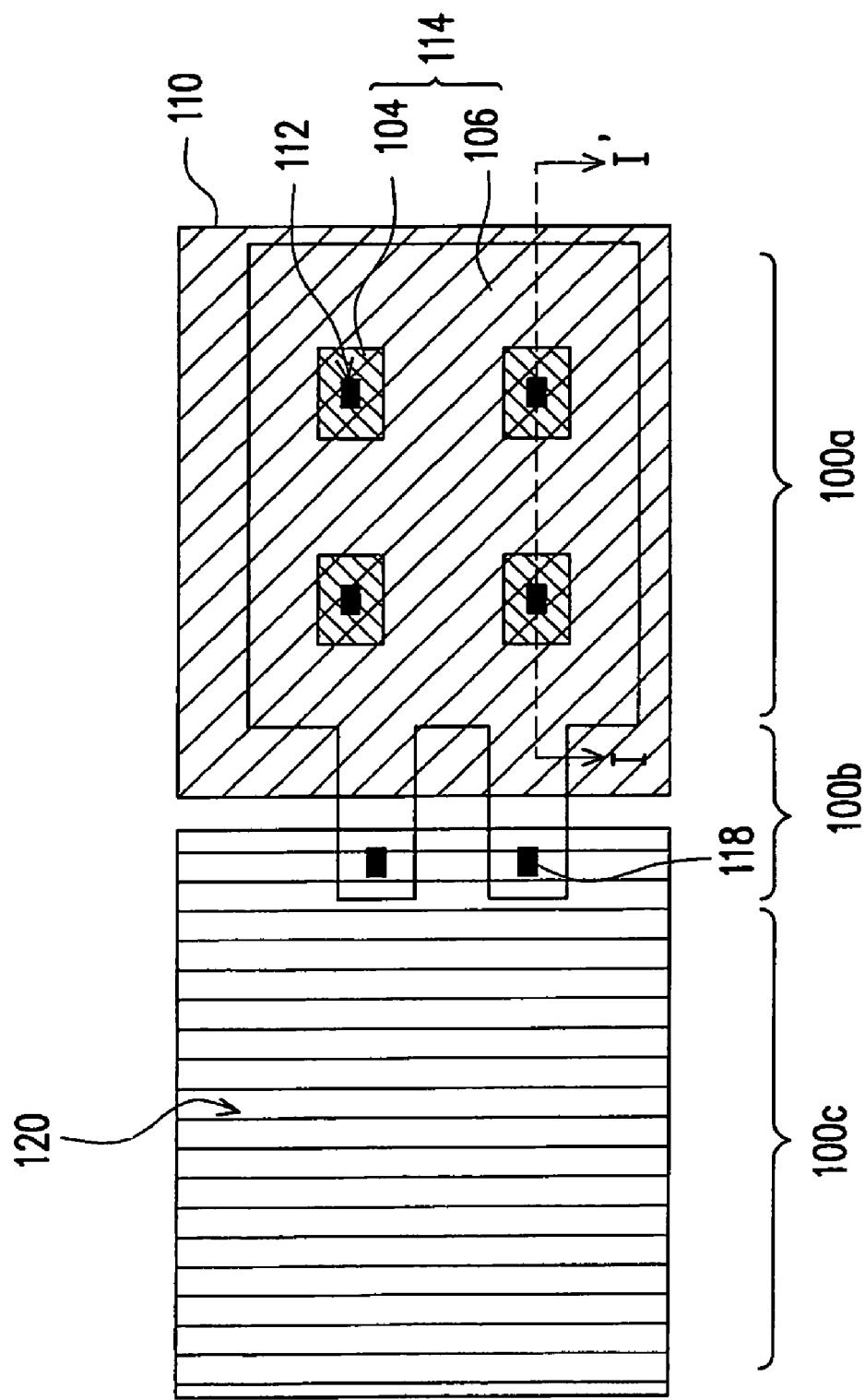
FIG. 1A is a top view of the power MOSFET array according to an embodiment of the present invention.
Figure 1B:
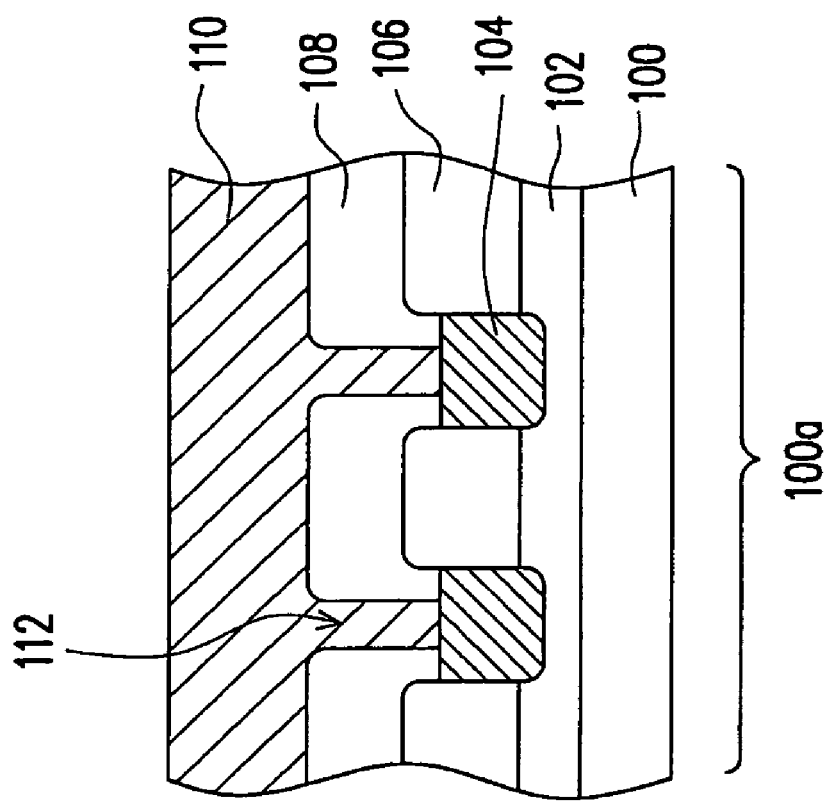
FIG. 1B is a simplified sectional view of FIG. 1A along line I-I'.

FIG. 1A is a top view of the power MOSFET array according to an embodiment of the present invention. FIG. 1B is a simplified sectional view of FIG. 1A along line I-I'.

Referring to FIGS. 1A and 1B, the power MOSFET array of the present invention includes a substrate 100, an epitaxy layer 102, a plurality of gates 104, a plurality of source regions 106, a gate pad 110, and a source pad 120.

The substrate 100 has a device region 100a, a circuit connection region 100b, and a source pad region 100c. The epitaxy layer 102 is disposed above the substrate 100. In the power MOSFET array, the substrate 100 serves as a drain. Further, for example for an N type power MOSFET, the conductive type of the substrate 100 is, for example, N type, and the conductive type of the epitaxy layer 102 is P type.

Referring to FIGS. 1A and 1B, the plurality of gates 104 is disposed on the epitaxy layer 102 in the device region 100a. The gates 104 disposed on the epitaxy layer 102 are mutually electrically insulated. A source region 106 is disposed on the epitaxy layer 102 between the gates 104, and a portion of the source region 106 extends to the circuit connection region 100b. The source region 106 and the gates 104 together form a power MOSFET array 114 (as shown in FIG. 1A). For example, for the N type power MOSFET, when the conductive type of the substrate 100 is, for example N type, and the conductive type of the epitaxy layer 102 is P type, the conductive type of the source region 106 is N type.

An insulation layer 108 is further disposed above the substrate 100, the insulation layer 108 covers the device region 100a and the circuit connection region 100b, and the insulation layer 108 has a plurality of gate contact openings 112 in the device region 100a, for respectively exposing the gates 104. At the same time, the insulation layer 108 has a plurality of source contact openings 118 in the circuit connection region 100b, for exposing the source regions 106. In addition, the material of the insulation layer 108 is, for example, silica, silicon nitride, or silicon oxynitride etc. The gate pad 110 is disposed on the insulation layer above the device region 110a in the substrate 100, and the gate pad 110 electrically contacts with the gates 104 respectively through the gate contact openings 112 in the insulation layer 108. That is to say, the gate pad 110 is disposed above the power MOSFET array 114 and covers the power MOSFET array 114.

Next, the power MOSFET array 114 further includes a source pad 120 disposed above a region beyond the gate pad 110 of the substrate 100, i.e., above the source pad region 100c. The source pad 120 covers the source pad region 100c and covers a portion of the circuit connection region 100b. Further, the source pad 120 is electrically connected to the source region 106 through the source contact openings 118 in the insulation layer 108 in the circuit connection region 100b.

Figure 2A:
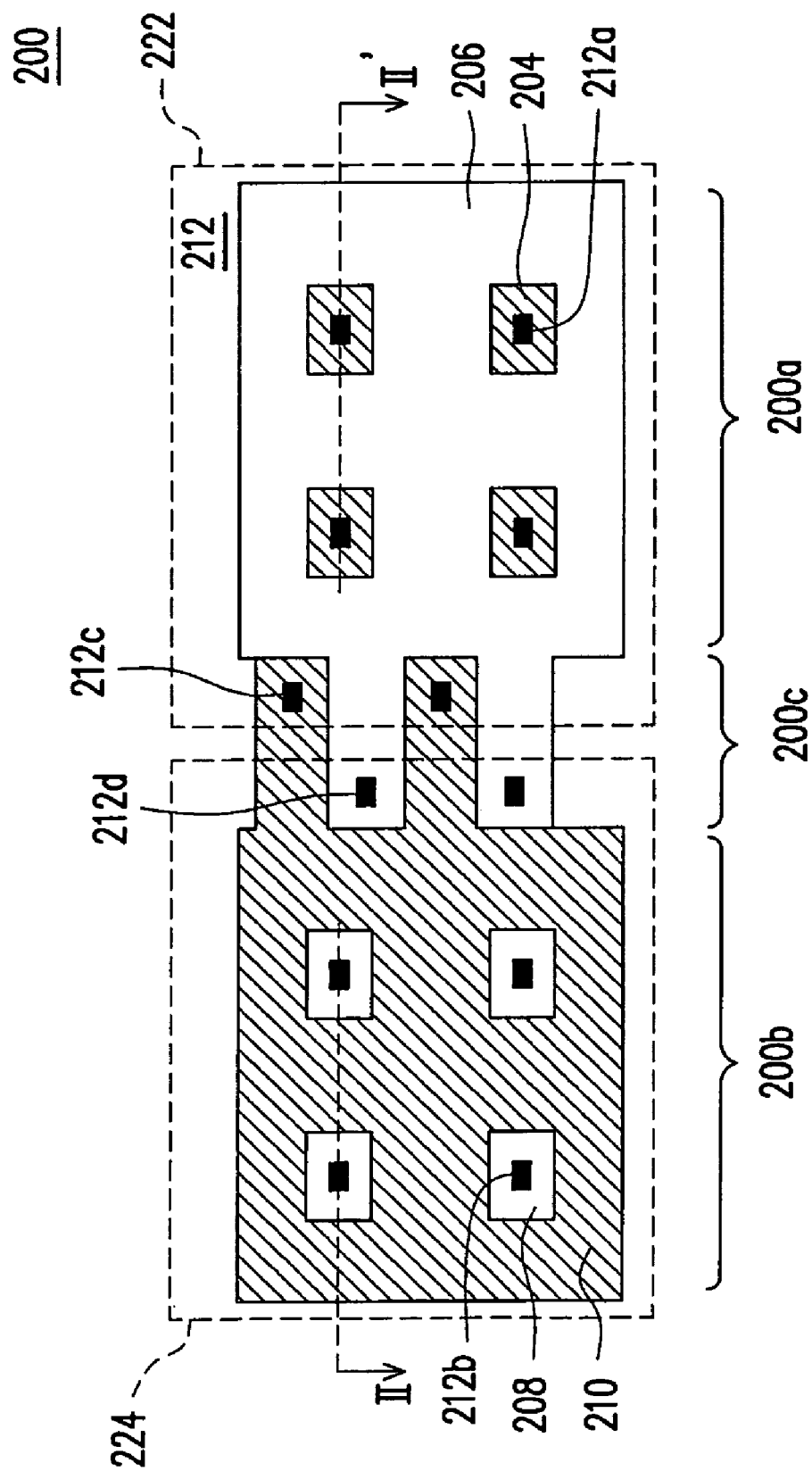
FIG. 2A is a top view of the power MOSFET array pair according to an embodiment of the present invention.
Figure 2B:
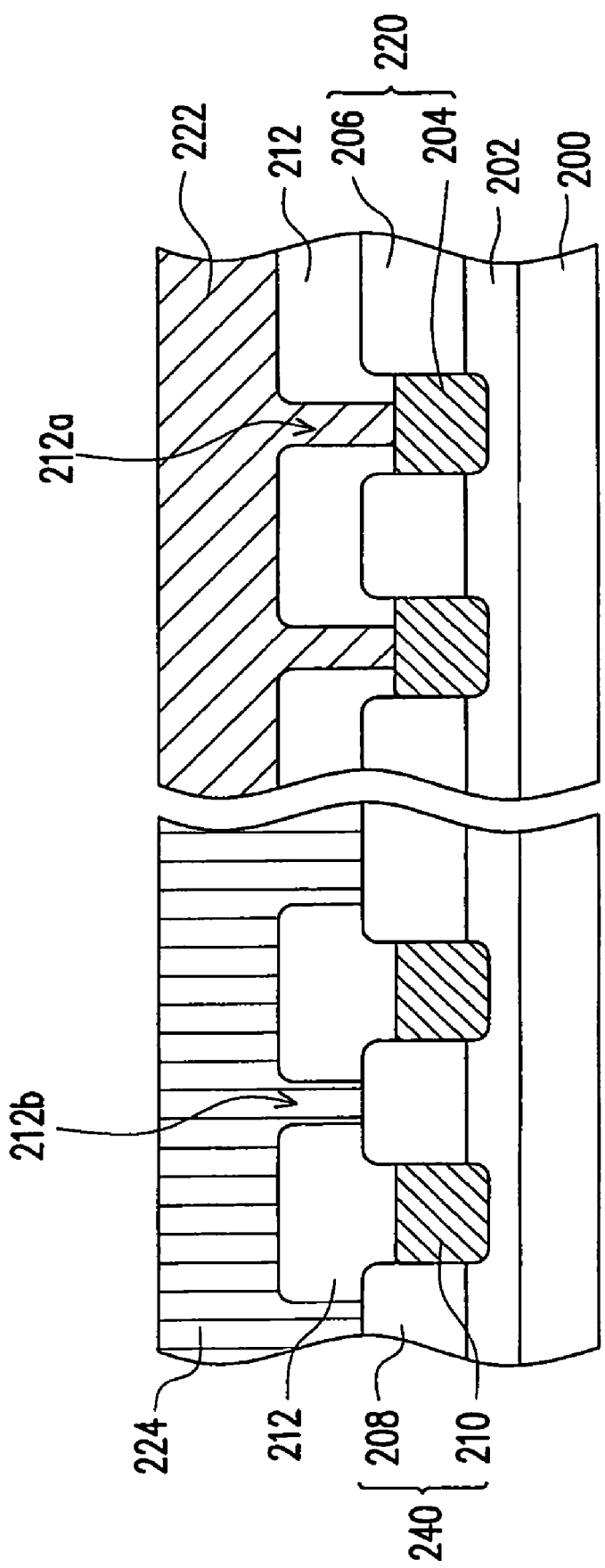
FIG. 2B is a simplified sectional view of FIG. 2A along line II-II'.

FIG. 2A is a top view of the power MOSFET array pair according to an embodiment of the present invention. FIG. 2B is a simplified sectional view of FIG. 2A along line II-II'.

Referring to FIG. 2A, the power MOSFET array pair of the present invention is disposed on a substrate 200 and includes an epitaxy layer 202, a plurality of first gates 204, a first source 206, a plurality of second sources 208, a second gate 210, a gate pad 222, and a source pad 224. The substrate 200 has a first device region 200a, a second device region 200b, and a circuit connection region 200c. The circuit connection region 200c is disposed between the first device region 200a and the second device region 200b. In addition, a portion of the substrate 200 in the first device region 200a serves as a first drain, and a portion of the substrate 200 in the second device region 200b serves as a second drain.

Referring to FIGS. 2A and 2B, the epitaxy layer 202 is disposed on the substrate 200, and a portion of the epitaxy layer 202 in the first device region 200a has a plurality of first gates 204 electrically insulated from each other. A first source region 206 is disposed on the epitaxy layer 202 between the first gates. The first source region 206 is, for example, a portion of the epitaxy layer 202, that is, a portion of the epitaxy layer 202 exposed by the first gates 204 is converted to a doped region of the first source region 206 by means of ion-implantation. In addition, the first source region 206 partially extends to the circuit connection region 200c between the first device region 200a and the second device region 200b. It should be noted that the first source region 206 and the first gates 204 form a first power MOSFET array 220.

In the second device region 200b, a plurality of second source regions 208 electrically insulated from each other are disposed on a portion of the epitaxy layer 202 and at a height level as same as those of the first gates 204 and the first source region 206. A second gate 210 is disposed on the exposed epitaxy layer 202 between the second source regions 208. In addition, the second gate 210 partially extends to the circuit connection region 200c between the first device region 200a and the second device region 200b. The second source regions 208 are, for example, a portion of the epitaxy layer 202, that is, a plurality of doped regions serving as the second source regions 208 is formed in the epitaxy layer 202 by means of ion-implantation. It should be noted that the second source regions 208 and the second gate 210 form a second power MOSFET array 240.

An insulation layer 212 covers the substrate 200, and the material of the insulation layer 212 is, for example, silica, silicon nitride, or silicon oxynitride etc. A portion of the insulation layer 212 in the first device region 200a covers the first source region 206, and the insulation layer 212 has a plurality of first gate contact openings 212a in the first device region 200a. The first gate contact openings 212a respectively expose the first gates 204. In addition, in the second device region 200b, the insulation layer 212 covers the second gate 210, and in the second device region 200b, the insulation layer 212 has a plurality of first source contact openings 212b respectively exposing the second source regions 208.

Further, in the circuit connection region 200c, the insulation layer 212 has a plurality of second gate contact openings 212c and a plurality of second source contact openings 212d, respectively exposing a portion of the second gate 210 and the first source region 206 in the circuit connection region 200c.

Next, referring to FIGS. 2A and 2B, a gate pad 222 is disposed right above the first power MOSFET array 220. The gate pad 222 is electrically connected to the first gates 204 in the first device region 200a through the first gate contact openings 212a in the insulation layer 212. At the same time, the second gate 210 in the second device region 200b is electrically connected to the gate pad 222 through the second gate contact openings 212c of the insulation layer 212 in the circuit connection region 200c.

At the same time, a source pad 224 is disposed right above the second power MOSFET array 240. The source pad 224 is electrically connected to the second source regions 208 disposed in the second device region 200b through the first source contact openings 212b in the insulation layer 212. The first source 206 in the first device region 200a is electrically connected to the source pad 224 through the second source contact openings 212d of the insulation layer 212 in the circuit connection region 200c.

To sum up, in the present invention, the MOSFET array is disposed under the gate pad, the disposing quantity of the MOSFETs of unit area is improved, thereby increasing the device integration. In addition, by using the circuit connection region, the MOSFET array disposed under the gate pad is electrically connected to the source pad above the non-array. In other aspect, similarly through the circuit connection region, the MOSFET array disposed under the gate pad and the MOSFET array disposed under the source pad can form an array pair, so as to share the same gate pad and source pad. Accordingly, the volume of the array pair is reduced, the integration is improved, such that the application scope of the power MOSFET array becomes broader.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power metal-oxide-semiconductor field-effect transistor (MOSFET) array, comprising:
   a substrate, serving as a drain, wherein the substrate has a device region;
   an epitaxy layer, disposed on the substrate;
   a plurality of gates, disposed on the epitaxy layer in the device region, wherein the gates are separated from each other;
   a continuous source region, disposed on the epitaxy layer to circle each of the gates, wherein the continuous source region and the gates form a power MOSFET array; and
   a gate pad, disposed above the power MOSFET array, wherein the gate pad is electrically connected to the gates.

2. The power MOSFET array as claimed in claim 1, wherein an insulation layer is disposed between the gate pad and the epitaxy layer, the insulation layer covers the continuous source region, and the insulation layer has a plurality of gate contact openings respectively exposing the gates.

3. The power MOSFET array as claimed in claim 2, wherein the gate pad is electrically connected to the gates respectively through the gate contact openings.

4. The power MOSFET array as claimed in claim 2, wherein the substrate further comprises a circuit connection region, and the insulation layer has a plurality of source contact openings in the circuit connection region, so as to expose a portion of the continuous source region.

5. The power MOSFET array as claimed in claim 4, further comprising a source pad disposed on a non-gate pad region above the substrate.

6. The power MOSFET array as claimed in claim 5, wherein the source pad is electrically connected to the continuous source region through the source contact openings.

7. A power MOSFET array pair, comprising:
   a substrate, wherein the substrate has a first device region, a second device region, and a circuit connection region, a portion of the substrate in the first device region serves as a first drain, and a portion of the substrate in the second device region serves as a second drain;
   an epitaxy layer, disposed on the substrate;
   a plurality of first gates, disposed on the epitaxy layer in the first device region, wherein the first gates are separated from each other;
   a first source region, disposed on the epitaxy layer between the first gates, wherein the first source region and the first gates form a first power MOSFET array;
   a plurality of second source regions, disposed on the epitaxy layer in the second device region, wherein the second source regions are separated from each other;
   a second gate, disposed on the epitaxy layer between the second source regions, wherein the second gate and second source regions form a second power MOSFET array;
   a gate pad, disposed right above the first power MOSFET array and fully covering the first power MOSFET array, wherein the gate pad is electrically connected to the first gates and the second gate in the second device region is electrically connected to the gate pad through the circuit connection region; and
   a source pad, disposed right above the second power MOSFET array and fully covering the second power MOSFET array, wherein the source pad is electrically connected to the second source regions and the first source region in the first device region is electrically connected to the source pad through the circuit connection region so that the first MOSFET array and the second MOSFET array share the same gatepad and the same source pad.

8. The power MOSFET array pair as claimed in claim 7, wherein the circuit connection region is disposed between the first device region and the second device region.

9. The power MOSFET array pair as claimed in claim 7, wherein an insulation layer is disposed between the gate pad and the epitaxy layer.

10. The power MOSFET array pair as claimed in claim 9, wherein in the first device region, the insulation layer covers the first source region, and the insulation layer has a plurality of first gate contact openings respectively exposing the first gates.

11. The power MOSFET array pair as claimed in claim 10, wherein the gate pad is electrically connected to the first gates respectively through the first gate contact openings.

12. The power MOSFET array pair as claimed in claim 9, wherein in the second device region, the insulation layer covers the second gate, and the insulation layer has a plurality of first source contact openings respectively exposing the second source regions.

13. The power MOSFET array pair as claimed in claim 12, wherein the source pad is electrically connected to the second source regions respectively through the first source contact openings.

14. The power MOSFET array pair as claimed in claim 7, wherein the insulation layer has a plurality of second gate contact openings and a plurality of second source contact openings in the circuit connection region, respectively exposing a portion of the second gate and the first source region.

15. The power MOSFET array pair as claimed in claim 14, wherein the source pad is electrically connected to the first source region through the second source contact openings disposed in the circuit connection region.

16. The power MOSFET array pair as claimed in claim 14, wherein the gate pad is electrically connected to the second gate through the second gate contact openings disposed in the circuit connection region.

* * * * *